(12) United States Patent
Brady et al.

(10) Patent No.: US 6,638,832 B2
(45) Date of Patent: Oct. 28, 2003

(54) ELIMINATION OF NARROW DEVICE WIDTH EFFECTS IN COMPLEMENTARY METAL OXIDE SEMICONDUCTOR (CMOS) DEVICES

(75) Inventors: Frederick T. Brady, San Antonio, TX (US); Jon Maimon, Manassas, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/741,028

(22) Filed: Dec. 21, 2000

(65) Prior Publication Data
US 2002/0081797 A1 Jun. 27, 2002

(51) Int. Cl.[7] ............................................. H01L 21/76
(52) U.S. Cl. ........................ 438/424; 438/524; 438/528
(58) Field of Search ............................ 438/424, 247, 438/275, 149, 404, 153, 154, 157, 159; 257/348, 296

(56) References Cited

U.S. PATENT DOCUMENTS

| 4,728,619 | A |   | 3/1988  | Pfiester et al. |         |
|-----------|---|---|---------|-----------------|---------|
| 4,885,257 | A |   | 12/1989 | Matsushita      |         |
| 5,314,841 | A |   | 5/1994  | Brady et al.    |         |
| 5,358,879 | A |   | 10/1994 | Brady et al.    |         |
| 5,360,752 | A |   | 11/1994 | Brady et al.    |         |
| 5,397,909 | A |   | 3/1995  | Moslehi         |         |
| 5,527,724 | A |   | 6/1996  | Brady et al.    |         |
| 5,891,787 | A | * | 4/1999  | Gardner et al.  | 438/424 |
| 6,121,651 | A | * | 9/2000  | Furukawa et al. | 257/296 |
| 6,121,660 | A | * | 9/2000  | Yamazaki et al. | 257/348 |
| 6,153,476 | A | * | 11/2000 | Inaba et al.    | 438/275 |
| 6,218,219 | B1| * | 4/2001  | Yamazaki et al. | 438/149 |
| 6,323,082 | B1| * | 11/2001 | Furukawa et al. | 438/247 |

* cited by examiner

Primary Examiner—Carl Whitehead, Jr.
Assistant Examiner—Laura M Schillinger
(74) Attorney, Agent, or Firm—Swidler Berlin Shereff Friedman, LLP

(57) ABSTRACT

Neutral conductivity ions, preferably germanium, are implanted through the oxide of a metal oxide semiconductor after isolation formation to provide a nearly constant threshold voltage for transistor operation independent of transistor channel width as device geometries are scaled down in size. The present invention sets forth a method for fabricating a metal oxide semiconductor (MOS) structure that controls threshold voltage $V_t$ in the structure, the method including generating an isolation region of the semiconductor structure on a major surface of a silicon substrate, growing a thin oxide on the major surface of the semiconductor structure, implanting a large diameter neutral conductivity type ion into the major surface of the semiconductor structure through the thin oxide, annealing the semiconductor structure having the neutral conductivity ion implanted therein, and processing the semiconductor structure to create MOS devices having a near constant threshold voltage over a range of device channel widths.

15 Claims, 3 Drawing Sheets

ELIMINATION OF NARROW DEVICE WIDTH EFFECTS IN COMPLEMENTARY METAL OXIDE SEMICONDUCTOR (CMOS) DEVICES

FIELD OF THE INVENTION

This invention relates in general to methods for manufacturing microelectronic devices and integrated circuits and, more particularly, to fabrication of large scale complementary metal oxide semiconductor (CMOS) integrated circuits (ICs), which contain reduced channel width transistors.

BACKGROUND OF THE INVENTION

Construction of CMOS integrated circuits generally begins with the fabrication of a semiconductor substrate surface of two different conductivity types. The semiconductor substrate surface is fabricated usually in the form of regions of n-conductivity type silicon adjacent to regions of p-conductivity type silicon (Si). In one form, such a surface could be a p-type substrate having a n-well or tub region formed therein. Thus, the p-channel devices are formed in the n-well and the n-channel devices are formed in the surface that remains p-conductivity type.

Due to technological advancement, semiconductor devices are scaling down in size. Meanwhile, individual transistors are scaling down both in channel length and in channel width. Devices having a width of 1 micron ($\mu$) or smaller are known as "narrow width" devices. An example of a wide device is one having a width of $10\mu$.

A problem for narrow width devices is control of threshold voltage ($V_t$). Typically, the threshold voltage either strongly increases or decreases between wide devices and narrow width devices. This change in $V_t$, can create problems. For example, a high $V_t$ can decrease transistor drive current causing slow performance. Also, a low $V_t$ can cause source-drain leakage current. Thus, it would be desirable to be able to maintain a constant $V_t$ over various transistor channel widths.

Germanium implantation has been used to change field isolation characteristics. For further information, the reader is directed to, e.g., U.S. Pat. No. 4,728,619 to Pfiester et al., the contents of which are incorporated herein by reference in their entirety. The Pfiester patent discloses using germanium implantation as a channel stop to increase field oxide threshold voltage. A high energy implant is done prior to field oxide growth to retard movement of the dopant, particularly boron, during subsequent integrated circuit fabrication processing.

What is needed is a method for controlling transistor device characteristics to maintain a near constant threshold voltage over a range of transistor channel widths, particularly as the transistor channel width drops below 0.5 microns.

SUMMARY OF THE INVENTION

The present invention provides control of threshold voltage ($V_t$) for metal oxide semiconductor (MOS) transistors over a wide range of transistor device widths. Degradation of threshold voltage levels for transistors having small channel widths is prevented.

Briefly, after forming an isolation region separating transistors, the present invention employs a shallow, high dose blanket germanium implantation. The process of the present invention can employ a low-energy germanium (Ge) implant and is suitable for MOS transistors formed using local oxide isolation or shallow trench isolation techniques. Threshold voltage ($V_t$) can be controlled to be a nearly constant value for transistors having large or small device features. Changes in semiconductor device processing can include a Ge implantation and a low temperature anneal.

The present invention, in one embodiment, sets forth a method for fabricating a metal oxide semiconductor (MOS) structure that controls threshold voltage $V_t$ in the structure, the method including generating an isolation region of the semiconductor structure on a major surface of a silicon substrate, implanting a germanium or other large diameter neutral conductivity type ion into the major surface of the semiconductor structure, annealing the semiconductor structure having the germanium ion implanted therein, and processing the semiconductor structure to create MOS devices having a near constant threshold voltage over a range of device channel widths.

In one embodiment of the invention, prior to the implanting step, the method can include growing a thin oxide on the major surface of the semiconductor structure. In another embodiment of the present invention, implanting includes implanting a dosage of between 1E14 and 1E16 per centimeter squared.

In yet another embodiment of the present invention, implanting includes blanket implanting to a depth of between 200 and 1,000A.

In another embodiment, the annealing includes annealing in a furnace or in a rapid thermal processing (RTP) tool.

In an example embodiment, annealing includes annealing out implant damage at a temperature of between 800 and 950° C. for between 15 and 45 minutes.

In another embodiment, the MOS devices are formed using local oxide isolation.

In an embodiment of the present invention, the MOS devices are formed using shallow trench isolation techniques.

In another, the range of the device channel widths is between $1.0\mu$ and $10.0\mu$, inclusively.

In another embodiment of the invention, the range of the device channel widths is less than or equal to $1.0\mu$ and greater than zero.

In another embodiment, the device channel widths are less than or equal to $0.5\mu$ and greater than zero.

In another embodiment, the thin oxide layer is 200A thick or less and greater than zero.

In one embodiment of the invention, a metal oxide semiconductor (MOS) structure is disclosed featuring a Si substrate, an isolation region of the structure formed on a major surface of the Si substrate, a thin oxide grown on the major surface, and a germanium ion dopant implanted into the major surface of the Si substrate through the thin oxide and annealed, wherein the structure has a near constant threshold voltage $V_t$ over a range of device channel widths.

In another embodiment, the MOS devices are formed using local oxide isolation.

In yet another embodiment, the MOS devices are formed using shallow trench isolation techniques.

In another embodiment, the range of the device channel widths is between $1.0\mu$ and $10.0\mu$, inclusively.

In yet another embodiment, the range of the device channel widths is less than or equal to $1.0\mu$ and greater than zero.

In another embodiment, the device channel widths are less than or equal to $0.5\mu$ and greater than zero.

Further features and advantages of the invention, as well as the structure and operation of various embodiments of the invention, are described in detail below with reference to the accompanying drawings.

BRIEF DESCRIPTION OF THE DRAWINGS

The foregoing will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE PREFERRED EMBODIMENT

Figure 1:
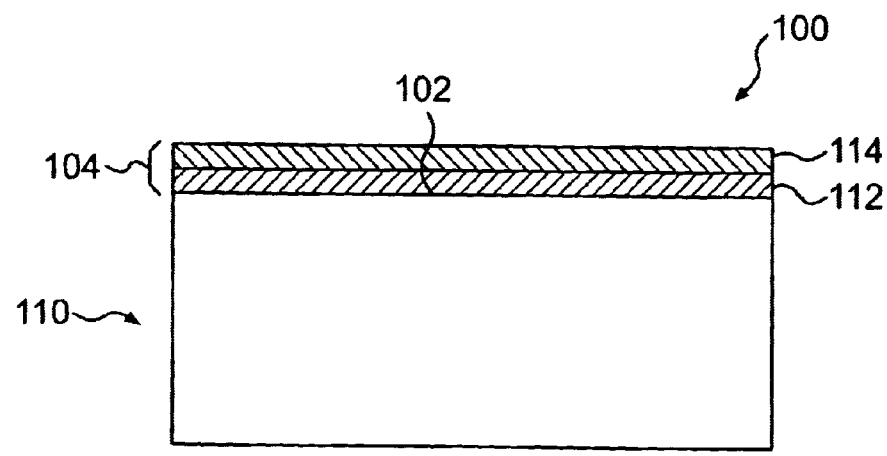
FIG. 1 is a cross-sectional view of a semiconductor substrate having a pad nitride formed thereon in an exemplary embodiment of the present invention.

The preferred embodiment of the invention is discussed in detail below. While specific implementations are discussed, it should be understood that this is done for illustration purposes only. A person skilled in the relevant art will recognize that other components and configurations may be used without departing from the spirit and scope of the claimed invention.

In semiconductor integrated chip (IC) technology, active semiconductor devices such as complementary metal oxide semiconductor (CMOS) devices can be laterally isolated from each other by oxidized regions in a silicon film on the surface of the chip. The oxidized regions can be formed by what is known as a local oxidation of silicon (LOCOS) process. For sub-micron feature sizes in semiconductor chips, the LOCOS process can be difficult to carry out. As a result, semiconductor manufacturers using bulk silicon based CMOS ICs can use shallow trench isolation (STI) to isolate CMOS devices within the IC chip. Shallow trench isolation is described, e.g., in U.S. patent application Ser. No. 08/987,016 entitled "Shallow Isolation Trench Forming Process for Silicon-On-Insulator Technology," of common assignee to the present invention, the contents of which are incorporated herein by reference in their entirety. It is important to note that the referenced STI patent refers to a specific example method of performing shallow trench isolation on Si-on-insulation (SOI). The present invention is equally applicable to SOI and bulk Si. The data collected and depicted in and described with reference to FIG. 6, below, is taken on bulk Si.

As ICs continue to scale down in size, both LOCOS and STI oxide isolation techniques can be employed. As the IC devices are scaled down, they are scaled down in length and width. Conventionally, as IC devices scale down, the voltage they operate at has also been reduced from 5 volts to 2.5 volts and lower. Difficulties can arise when devices of varying widths are used within the same IC. Problems can occur when transistor channel width drops below 1 micron. The required threshold voltage $V_t$ which can be used to turn on a transistor can be too low. This lowering of threshold voltage can cause the device to appear, what is commonly referred to as, "leaky." Attempts to increase the threshold voltage ($V_t$) can cause poor or slow performance in wide transistor devices, such as, e.g., a device having a $10\mu$ width.

The ionic implant in an exemplary embodiment of the present invention begins after the isolation regions 318, 418 and 518, are formed, as is discussed below with reference to FIG. 4. In an example embodiment of the present invention, the isolation region 318, 418 and 518, can be formed using a process that forms structures as illustrated by structures 100, 200 and 300 of FIGS. 1, 2 and 3, respectively. The example embodiment is intended to illustrate one method of forming an isolation region. The example embodiment is not intended to limit the described implantation process of the invention to isolation regions formed according to the steps described with reference to FIGS. 1–3. The present invention is equally applicable to isolation regions formed using other techniques including the use of LOCOS, STI and other isolation techniques.

It is important to note that the implantation technique of the present invention is equally applicable to n-type and p-type field effect transistors (NFETs and PFETs).

FIG. 1 depicts an example embodiment of the present invention including a cross-sectional view of a semiconductor structure 100 including a silicon (Si) base layer 110 having a protective oxide layer 112 formed thereon. The present invention can be performed using an oxide layer, a nitride layer, or an oxynitride layer. Protective oxide layer 112 can provide a cushion for a more brittle nitride layer 114 which can be formed on the protective oxide layer 112 as shown. Protective oxide layer 112, sometimes called a pad oxide 112, can also protect the silicon surface 102 of silicon base layer 110 from ion implantation damage. Protective oxide layer 112 can also act as an etch stop for patterning and removal of the nitride layer 114 using etchants. The nitride layer 114, sometimes called a stack nitride 114, together with the pad oxide layer 112, form a so-called pad stack 104. The pad stack 104 can be used to define the active areas of the silicon surface 102. Semiconductor structure 100 can also be referred to as a silicon nitride stack.

Figure 2:
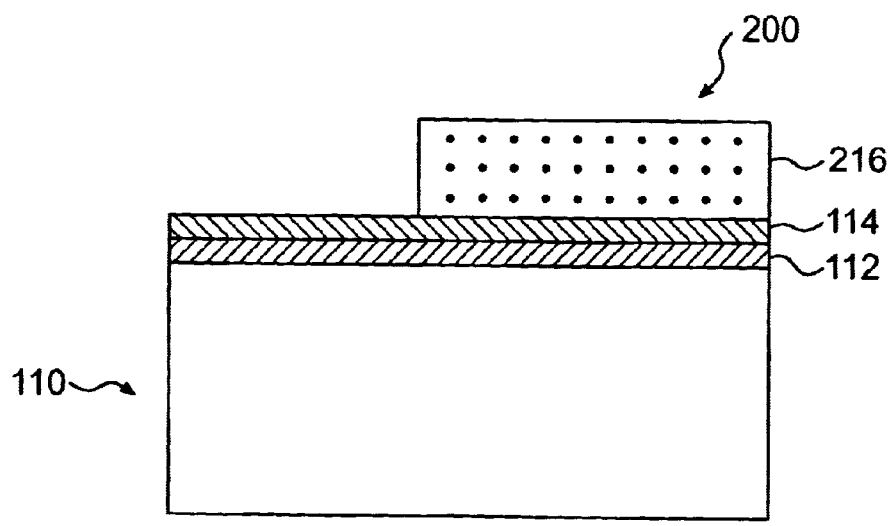
FIG. 2 is a cross-sectional view of a semiconductor substrate patterned to define active transistor and isolation regions in an example embodiment of the present invention.

FIG. 2 depicts a cross-sectional view of an example embodiment of a semiconductor structure 200. Semiconductor structure 200 can include the structure 100 of FIG. 1 and can further include, as shown in the example embodiment, a lithographic layer of resist 216, that has been patterned onto the silicon nitride stack of semiconductor structure 100 of FIG. 1. The resist 216 can be used to define active regions of silicon base layer 110. Resist 216 can also be used as a mask to define isolation areas to be formed.

Figure 3:
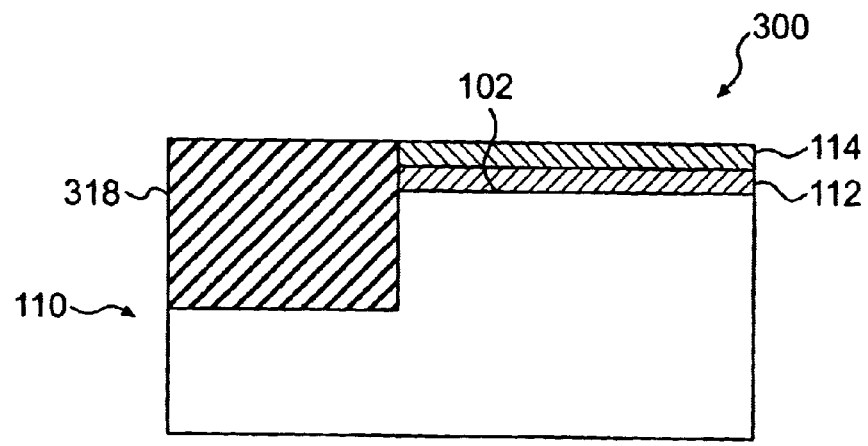
FIG. 3 is a cross-sectional view of formation of the isolation regions in an exemplary embodiment of the present invention.
Figure 4:
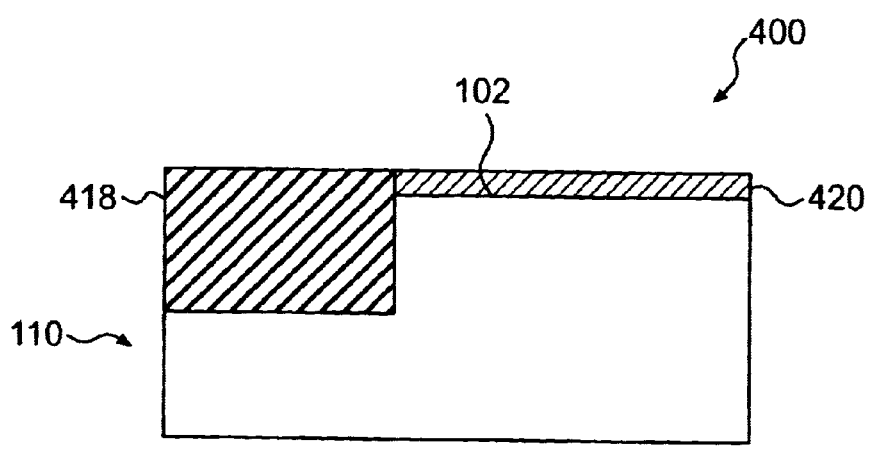
FIG. 4 is a cross-sectional view after formations of the isolation regions and thin oxide in an exemplary embodiment of the present invention.

FIG. 3 depicts an exemplary embodiment of the present invention including a cross-sectional view of a semiconductor structure 300. Semiconductor structure 300 includes an isolation region 318 formed as the result of etching semiconductor structure 200 with an etchant selective for etching oxide layer 112, nitride 114 and silicon base layer 110, using resist 216 as a mask. After stripping the resist 216, an oxide layer (as shown) can be deposited in isolation region 318 and planarized using standard chemical mechanical polishing (CMP), with nitride layer 114 acting as a polish stop material. Following the formation of the isolation region 318, a densification anneal can be performed. The isolation region 318 can also be formed using one of several local oxidation of silicon (LOCOS) techniques, where rather than removing the silicon using an etchant, it is oxidized in a high temperature oxygen or steam ambient.

Next, the nitride pad 114 can be removed along with the underlying pad oxide layer 112. As shown in structure 400 of FIG. 4, subsequent to pad removal, a thin oxide layer 420 of typical thickness 200 Å, or less, can be grown on the silicon surface 102 of silicon active regions of silicon (Si) base layer 110 using thermal oxidation. Thin oxide layer 420 can be used as a protective oxide for the silicon surface 102 during ion implantation to prevent contamination and to minimize channeling of ions within the silicon base layer 110.

Figure 5:
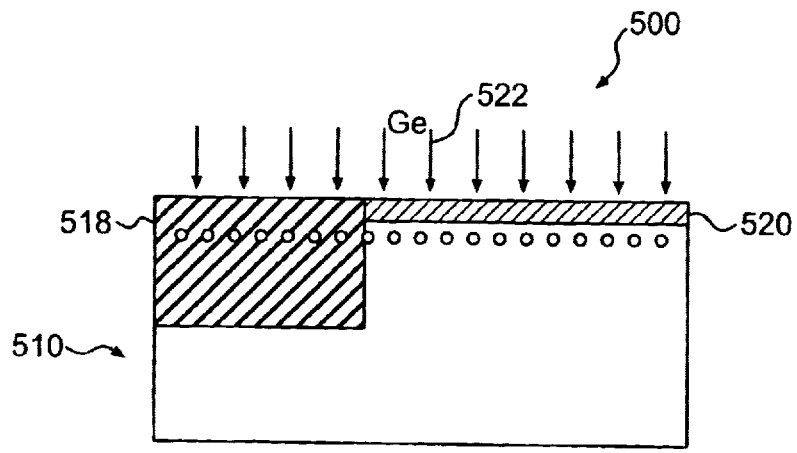
FIG. 5 is a cross-sectional view of germanium implantation within active regions of the semiconductor device in an embodiment of the present invention.

FIG. 5 illustrates a structure 500 formed by ion implantation using a large diameter neutral conductivity type ion such as, e.g., a germanium ion implant 522. Ion implantation can involve direct non-thermal introduction of dopants into Si base layer 110 by ionic bombardment. Ion implantation is the preferred method of introducing dopant impurities because modem VLSI device design can demand shallow junction depths ($<0.5\mu$) and lower temperature processing than can be obtainable using thermal diffusion techniques. Implant technology can use accelerated ionized impurity atoms that come to rest at precise depths within a silicon host. Advantages of ion implantation include very accurate dose control, source cleanliness, and the ability to introduce dopant atoms through existing passivation layers. The germanium implant 522, specifically, can have a dosage of 1E14 to 1E16, preferably 1E15 (per centimeter squared). Germanium implant 522 can be blanket implanted to a depth of between 200 and 1,000 Å over the entire surface of the semiconductor base layer 510. In an exemplary embodiment the structure can have a dopant concentration of between 1E14 and 1E16 per centimeter square. In another exemplary embodiment, the concentration of the dopant is $1 \times 10^{19}$ to $5 \times 10^{21}$ ion/cm$^3$. As is shown in FIG. 5, the germanium implant 522 can reach through the thin oxide layer 520 to reach base layer 510, but the germanium implant 522 cannot pass through isolation region 518 to reach part of base layer 510. The germanium implant is usually shallower than source/drain junction depths for both n- and p-diffusions.

Following the implant, the wafer substrate structure 500 can be annealed in a furnace or in a rapid thermal processing (RTP) tool to anneal out the implant damage of the silicon surface of structure 500 caused by the implant of the present invention. Preferably, the wafer substrate structure 500 can be annealed at a temperature of 800–950° C. for 15–45 minutes. The wafer can also be annealed in a rapid thermal annealer (RTA) at greater than (>) 950° C. for approximately less than (<) 5 minutes. The remainder of the integrated circuit processing can be performed on the silicon surface of structure 500 using standard, well known, CMOS processing steps.

The inventive process, as shown in the accompanying drawings can be performed immediately following the oxide isolation step. Further, the process of the present invention does not interfere with any of the standard CMOS process techniques. A masking step is not required. The implantation energy used can be very low because the depth of the implant is very shallow as depicted in FIG. 5.

Figure 6:
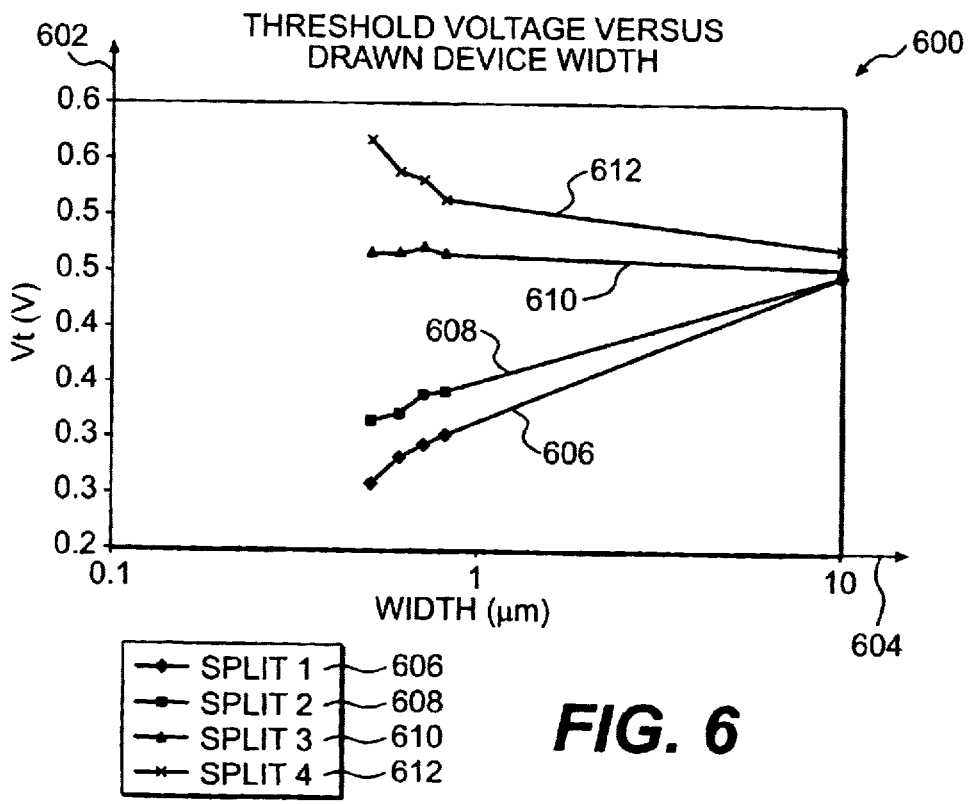
FIG. 6 shows the results of an exemplary embodiment of the present invention employing a germanium implantation process step.

The results of employing the processing steps of the present invention are depicted in FIG. 6. FIG. 6 depicts graph 600 including a vertical axis 602 and a horizontal axis 604. Graph 600 illustrates threshold voltage $V_t$ variation over various device widths. Vertical axis 604 shows that the threshold voltage $V_t$ varies with device width as shown on horizontal axis 604 for 4 different process variations. Specifically, graph 600 includes split no. 1, curve 606; split no. 2, curve 608; split no. 3, curve 610; and split no. 4, curve 612.

Split No. 3, curve 610 illustrates threshold voltage $V_t$ variation as a function of device width for bulk Si resulting from performance of the process of the present invention.

Split No. 1, curve 606, of FIG. 6 is the lower curve showing the voltage threshold $V_t$ as a function of device width for conventional semiconductor processing where no germanium implant was used.

Split No. 2, curve 608, of FIG. 6 shows device characteristics with a boron side wall implant to modulate narrow device width effects. This technique can be difficult because an ion implanter capable of a large angle such as, e.g., 30° implants, can be needed. Also, adding a side wall implant with sufficient dosage to minimize narrow width behavior can cause junction leakage problems. Low junction breakdown voltages caused by too high a P-type doping at the n+diffusion/p-well junction can also occur.

Split No. 3, curve 610, of FIG. 6 depicts $V_t$ for the inventive process with a shallow germanium implant 522 followed by an activation/passivation anneal as discussed above. One can note that curve 610 is substantially straight, i.e., threshold voltage $V_t$ remains substantially constant or horizontal over various device widths ranging from $10\mu$ down to sub-$\mu$ widths.

Split No. 4, curve 612, of FIG. 6 depicts a deep germanium implant at high implantation energy. Curve 612 illustrates that the deep germanium implant at high energy produced an increase in the voltage threshold $V_t$ as the device width decreased along horizontal axis 604 to sub-$\mu$ widths, i.e., widths of less than $1\mu$ but greater than zero.

The energy and dosage of the implantation can be varied to achieve a substantially constant threshold voltage $V_t$ independent of device width.

The processing steps described in the exemplary embodiment of the present invention include exemplary processing steps such as, e.g., ion implantation, however other means can be used including, e.g., equivalent processes providing, e.g., equivalent results, equivalent materials, device types and wafer structures.

While various embodiments of the present invention have been described above, it should be understood that they have been presented by way of example only, and not limitation. These and other modifications can be made to the process steps hereto without departing from the spirit and scope of the invention which is defined in the appended claims. Thus, the breadth and scope of the present invention should not be limited by any of the above-described exemplary embodiments, but should be defined only in accordance with the following claims and their equivalents.

What is claimed is:

1. A method for fabricating a semiconductor structure that controls threshold voltage $V_t$ in the structure, the method comprising:

(a) generating an isolation region of the semiconductor structure on a major surface of a silicon substrate;

(b) implanting a large diameter neutral conductivity type ion into said major surface of the semiconductor structure;

(c) annealing the semiconductor structure having said ion implanted therein; and (d) processing the semiconductor structure to create devices that, relative to eachother, have a near constant threshold voltage as a function of device channel width over a range of device channel widths.

2. The method according to claim 1, wherein said large diameter neutral conductivity type ion is a germanium ion.

3. The method according to claim 2, wherein said implanting includes implanting a dosage of between 1E14 and 1E16 per centimeter squared.

4. The method according to claim 3, wherein said implanting includes blanket implanting to a depth of between 200 and 1,000A.

5. The method according to claim 4, wherein said annealing includes annealing out implant damage in a furnace at a temperature of between 800 and 950° C. for between 15 and 45 minutes or more.

6. The method according to claim 4, wherein said annealing includes annealing out implant damage in a rapid thermal processing (RTP) tool at a temperature of above 950° C. for up to 5 minutes.

7. The method according to claim 1, wherein said devices are formed using local oxide isolation.

8. The method according to claim 1, wherein said devices are formed using shallow trench isolation techniques.

9. The method according to claim 1, wherein said range of said device channel widths is between 1.0 µm and 10.0 µm, inclusively.

10. The method according to claim 1, wherein said range of said device channel widths is less than or equal to 1.0 µm and greater than zero.

11. The method according to claim 1, wherein device channel widths are less than or equal to 0.5 µm and greater than zero.

12. The method according to claim 1, wherein after step (a), further comprising:

(e) growing a thin oxide on said major surface of the semiconductor structure.

13. The method according to claim 12, wherein said thin oxide layer is 200A thick or less and greater than zero.

14. The method according to claim 1, wherein said devices are metal oxide semiconductor (MOS) devices.

15. A method for fabricating a semiconductor structure that controls threshold voltage $V_t$ in the structure, the method comprising:

(a) generating an isolation region of the semiconductor structure on a major surface of a silicon substrate;

(b) implanting a large diameter neutral conductivity type ion into said major surface of the semiconductor structure; and (c) processing the semiconductor structure to create devices that, relative to each other, have a near constant threshold voltage as a function of the channel widths of each device over a range of device channel widths.

* * * * *